(12) United States Patent
Cheng et al.

(10) Patent No.: US 6,954,962 B1
(45) Date of Patent: Oct. 18, 2005

(54) MULTI-SCRAPER STRUCTURE FOR CLEANING A PANEL

(75) Inventors: Chien-Fa Cheng, Taoyuan Hsien (TW); Shih-Yu Hsu, Chung Li (TW); Tung-Kuei Chang, Taipei Hsien (TW); Chun-Chieh Hsu, Taoyuan Hsien (TW)

(73) Assignee: Chungwa Picture Tubes, Ltd., Taipei (TW)

(*) Notice: Subject to any disclaimer, the term of this patent is extended or adjusted under 35 U.S.C. 154(b) by 0 days.

(21) Appl. No.: 10/863,750

(22) Filed: Jun. 9, 2004

(30) Foreign Application Priority Data

Apr. 16, 2004 (TW) .............................. 93110749 A

(51) Int. Cl.⁷ .......................... A47L 11/00; C10B 43/04
(52) U.S. Cl. ..................................................... 15/93.1
(58) Field of Search ............................ 15/93.1, 236.05, 15/236.06

(56) References Cited

U.S. PATENT DOCUMENTS

| | | | | |
|---|---|---|---|---|
| 2,264,278 A | * | 12/1941 | Danforth ..................... | 15/93.1 |
| 3,074,090 A | * | 1/1963 | Thompson ................... | 15/93.1 |
| 5,081,734 A | * | 1/1992 | Sandford et al. ............ | 15/93.1 |
| 5,263,222 A | * | 11/1993 | Johnstone, II ........... | 15/236.02 |

* cited by examiner

Primary Examiner—Randall Chin

(57) ABSTRACT

The present invention discloses a multi-scraper structure. A plurality of scrapers is used in a cleaning panel process for repeatedly scraping the remnant contaminants on the surface of the panel. Moreover, a pressure control unit is used for immediately modifying the output pressure applied to a second scraper according to the resistance encountered by a first scraper.

4 Claims, 2 Drawing Sheets

MULTI-SCRAPER STRUCTURE FOR CLEANING A PANEL

FIELD OF THE INVENTION

The present invention relates to a multi-scraper structure, and especially to a structure for a multi-scraper structure for cleaning a panel.

BACKGROUND OF THE INVENTION

In general, a TFT-LCD comprises a bottom plate on which thin film transistors and pixel electrodes are formed, and a top plate on which color filters are constructed. The liquid crystal molecules are filled between the top plate and the bottom plate. During operation, a signal voltage is applied to the TFT, which is the switching element of each pixel unit. The TFT receives a signal voltage and it turns on so that data voltage carrying image information can be applied to the corresponding pixel electrode and to the liquid crystal via the TFT. When the data voltage is applied to the TFT, the orientation of the liquid crystal molecules is changed, thereby altering the optical properties and displaying the image.

There are three process groups, the array process, the cell process and the module assembly process, for forming a thin film transistor liquid crystal display (TFT-LCD). The array process, similar to the semiconductor manufacturing process, is to fabricate thin film transistors on a glass substrate. The cell process joins the arrayed back substrate and the front substrate that is fitted with a color filter. The space between the two substrates is filled with liquid crystal. The module assembly process involves connecting additional components, such as driver integrated circuits and backlight units, to the fabricated glass panel.

When joining the arrayed back substrate and the front substrate, the glue often remains on the surface of the panel, causing a joining mistake. Therefore, a cleaning panel process for removing the glue is performed to avoid the joining mistake.

A scraper with fixed pressure is used in a conventional cleaning panel process for removing the remnant glue. However, only using a single scraper to clean the panel limits the cleaning efficiency. Therefore, a manual cleaning process is always involved in the cleaning panel process. Furthermore, the pressure applied to the scraper is fixed. In other words, there is no buffer apparatus assembled in the scraper, which could otherwise protect the surface of the panel from harm.

SUMMARY OF THE INVENTION

The main purpose of the present invention is to provide a multi-scraper structure to improve the cleaning efficiency.

Another purpose of the present invention is to provide a multi-scraper structure with a pressure control unit for modifying the applied pressure immediately according to the resistance encountered by the scraper.

Another purpose of the present invention is to provide a multi-scraper structure with a feedback system. This feedback system can feed back the resistance met by each scraper to a corresponding pressure control unit to modify the applied pressure.

In accordance with the foregoing purposes, the present invention discloses a multi-scraper structure. A plurality of scrapers is used in a cleaning panel process for repeatedly scraping the remnant contaminants on the surface of the panel. Moreover, a pressure control unit is used for immediately modifying the output pressure according to the resistance met by the scraper to improve the cleaning efficiency.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Without limiting the spirit and scope of the present invention, the structure proposed in the present invention is illustrated with one preferred embodiment. Skilled artisans, upon acknowledging the embodiments, can apply the multi-scraper structure of the present invention to any kind of cleaning processes for removing the contaminants on the panels. According to the multi-scraper structure, a feedback system is used to feed back the resistance encountered by the first scraper to a pressure control unit to immediately modify the pressure provided to the second scraper to improve the cleaning efficiency. The usage of the present invention is not limited by the embodiment that follows.

Figure 1:
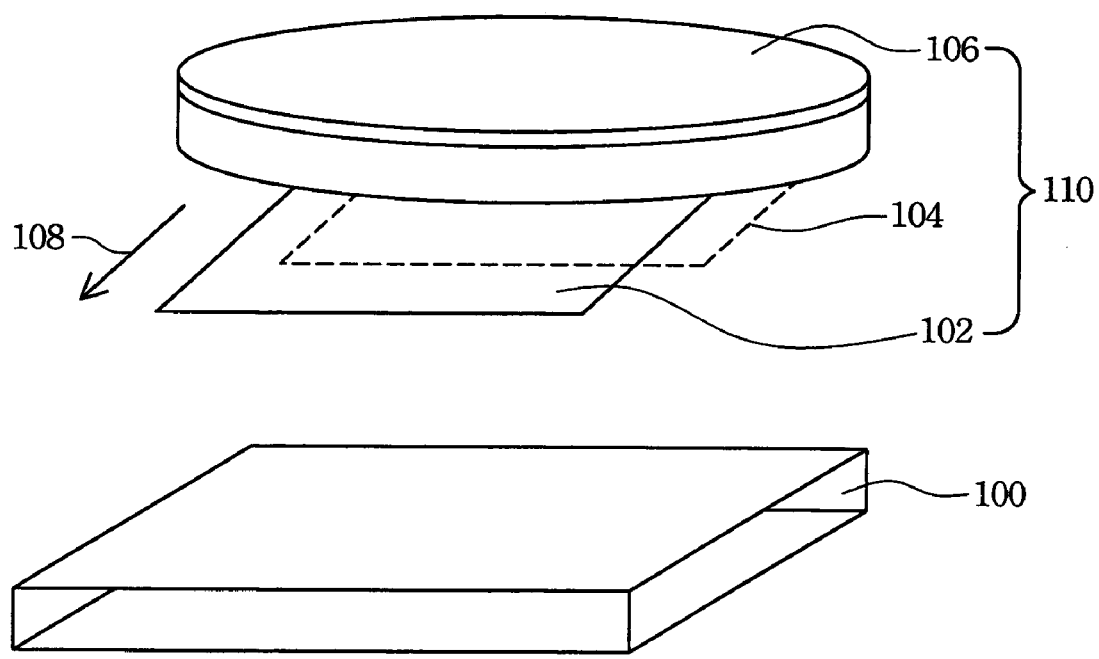
FIG. 1 illustrates a schematic diagram of the multi-scraper structure of the present invention.

In FIG. 1, a schematic diagram of the multi-scraper structure according to the present invention is illustrated. The panel 100 is the panel that joins the arrayed back substrate and the front substrate that is fitted with a color filter; and the space between the two substrates is filled with liquid crystal. The multi-scraper structure 110 according to the present invention is used to remove the remnant contaminants on the surface of the panel 100. The main purpose of this process is to ensure the perfect joining of the panel 100 with the polarizer.

According to the preferred embodiment of the present invention, the multi-scraper structure 110 comprises a first scraper 102, a second scraper 104 and a base 106 with a pressure control unit. The first and second scrapers 102 and 104 are arranged in parallel to each other and located on the base 106. When the multi-scraper 110 is used to remove the contaminants on the surface of the panel 100 along the direction of the arrow 108, the second scraper 104 scrapes the contaminants again if the first scraper 102 fails to remove the contaminants. Therefore, the cleaning efficiency is improved. Moreover, two independent pressure control units are used to respectively control the pressure applied to the two scrapers 102 and 104. Therefore, different pressures can be applied to the two scrapers 102 and 104. A pressure buffer apparatus is used to apply pressure to the scraper, which is provided to avoid breaking the panel 100 when too much resistance is met by the two scrapers 102 and 104. The pressure buffer apparatus is a spring, an air-pressure or a hydraulic-pressure buffer device.

Figure 2:
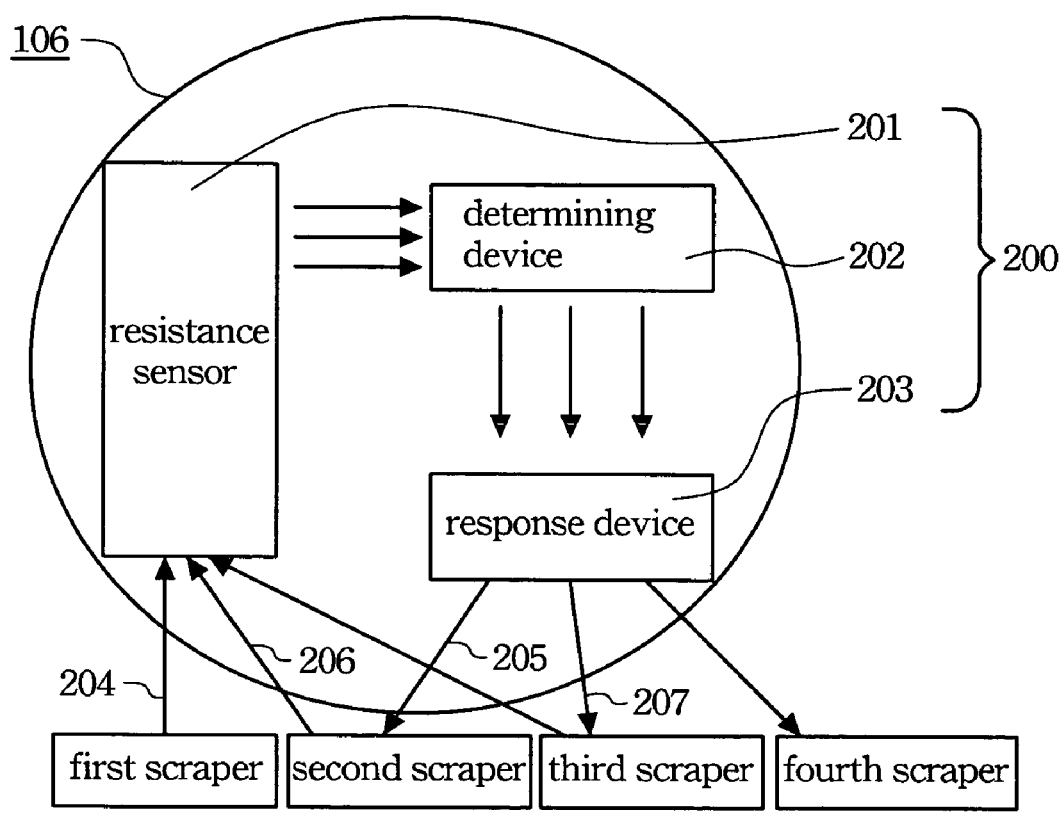
FIG. 2 illustrates a schematic diagram of a pressure control unit of the present invention.

FIG. 2 is a schematic diagram of a base 106 with a pressure control unit 200. A plurality of scrapers is located on the base 106. In a preferred embodiment, four scrapers, a first scraper, a second scraper, a third scraper and a fourth scraper, are used to clean the panel 100. The pressure control unit 200 comprises a resistance sensor 201, a determining device 202 and a response device 203. The resistance sensor 201 receives the feedback pressure from the scrapers and sends out a sensed pressure signal. The determining device 202 receives the sensed pressure signal from the resistance sensor 201 to modify the pressure and sends out a determining signal. The response device 203 receives the determining signal from the determining device 202 to provide the modified pressure to the scrapers. The response device 203 is a pressure buffer apparatus, such as a spring, an air-pressure or a hydraulic-pressure buffer device.

When using the multi-scraper to clean the panel, a certain pressure is applied to the first scraper from the response device 203. The resistance sensor 201 senses the resistance of the first scraper while the first scraper removes the contaminants on the surface of the panel 100. In other words, the first scraper transmits a resisted signal 204 to the resistance sensor 201. The resistance sensor 201 sends out a resistance signal to the determining device 202. The determining device 202 modifies the output pressure after receiving the signal from the resistance sensor 201 and sends out a determining signal to the response device 203. The response device 203 provides the modified pressure to the second scraper as shown by the number 205.

Next, the resistance sensor 201 senses the resistance of the second scraper while the second scraper removes the contaminants on the surface of the panel 100. Thus, the second scraper transmits a resistance signal 206 to the resistance sensor 201. Then, the resistance sensor 201 sends out a signal to the determining device 202. The determining device 202 modifies the output pressure after receiving the signal from the resistance sensor 201 and sends out a determining signal to the response device 203. The response device 203 provides the modified pressure to the third scraper as shown by the number 207. The same modifying method is then applied to the fourth scraper.

Hence, a feedback signal is used in the present invention to modify the pressure provided to each scraper immediately. For example, a serious resistance is encountered while the first scraper removes contaminants. Such a serious resistance requires a larger removing force. The resistance sensor 201 will communicate with the determining device 202 to modify the output pressure immediately after receiving the required feedback signal from the first scraper. Then, the response device 203 provides the modified pressure to the second scraper. By immediately modifying the pressure, the cleaning efficiency can be improved.

Accordingly, a plurality of scrapers in the multi-scraper structure is able to repeatedly scrape the surface of the panel to improve the cleaning efficiency. Moreover, a feedback system is used to feed back the resistance met by a scraper to immediately modify the pressure provided to the next scraper. A pressure buffer apparatus is used to provide pressure to the scraper to avoid breaking the panel.

As is understood by a person skilled in the art, the foregoing preferred embodiment of the present invention is illustrative of the present invention rather than limiting of the present invention. It is intended to cover various modifications and similar arrangements included within the spirit and scope of the appended claims, the scope of which should be accorded the broadest possible interpretation so as to encompass all such modifications and similar structure.

While the preferred embodiment of the invention has been illustrated and described, it will be appreciated that various changes can be made therein without departing from the spirit and scope of the invention.

What is claimed is:

1. A multi-scraper structure, comprising:
   a base;
   a plurality of scrapers arranged in parallel to each other and located on said base for removing contaminants on a panel; and
   a pressure control unit located in said base, further comprises:
      a resistance sensor for sensing resistance encountered by said scrapers and sends out a modifying signal;
      a determining unit for receiving said modifying signal to modify output pressure; and
      a response unit for providing said output pressure to said scrapers.

2. The structure of claim 1, wherein said response unit is a pressure buffer device.

3. The structure of claim 2, wherein said pressure buffer device is a spring, an air-pressure or a hydraulic-pressure buffer device.

4. The structure of claim 1, wherein said response unit can provide different pressure to said scrapers.

* * * * *

UNITED STATES PATENT AND TRADEMARK OFFICE
CERTIFICATE OF CORRECTION

PATENT NO. : 6,954,962 B1
APPLICATION NO. : 10/863750
DATED : October 18, 2005
INVENTOR(S) : Chien-Fa CHENG It is certified that error appears in the above-identified patent and that said Letters Patent is hereby corrected as shown below:

Assignee: Title page, item (73) should read -- Chunghwa Picture Tubes, Ltd., Taipei (TW) --

Signed and Sealed this

Twenty-first Day of November, 2006

JON W. DUDAS
*Director of the United States Patent and Trademark Office*